United States Patent
Liu

(10) Patent No.: US 11,177,813 B1
(45) Date of Patent: Nov. 16, 2021

(54) PHASE-LOCKED LOOP CIRCUIT, CONTROL METHOD THEREOF AND ELECTRONIC DEVICE

(71) Applicant: COMNAV TECHNOLOGY LTD., Shanghai (CN)

(72) Inventor: Jie Liu, Shanghai (CN)

(73) Assignee: COMNAV TECHNOLOGY LTD., Shanghai (CN)

( * ) Notice: Subject to any disclaimer, the term of this patent is extended or adjusted under 35 U.S.C. 154(b) by 0 days.

(21) Appl. No.: 17/245,267

(22) Filed: Apr. 30, 2021

(30) Foreign Application Priority Data

Sep. 18, 2020 (CN) .......................... 202010986555.3

(51) Int. Cl.
*H03L 7/081* (2006.01)
*H03L 7/089* (2006.01)

(52) U.S. Cl.
CPC .......... *H03L 7/0812* (2013.01); *H03L 7/0891* (2013.01)

(58) Field of Classification Search
CPC .............................. H03L 7/0812; H03L 7/0891
USPC ................................. 327/147–149, 156–158
See application file for complete search history.

(56) References Cited

U.S. PATENT DOCUMENTS

| | | | | |
|---|---|---|---|---|
| 5,940,609 A * | 8/1999 | Harrison | ................. | H03L 7/087 713/503 |
| 6,249,159 B1 * | 6/2001 | Johnson | ................. | H03L 7/087 327/148 |
| 6,337,601 B1 * | 1/2002 | Klemmer | ................. | H03L 7/083 331/117 R |
| 6,680,634 B1 * | 1/2004 | Ruha | ..................... | H03L 7/0816 327/158 |
| 6,970,047 B1 * | 11/2005 | Johnson | ................ | H03L 7/0816 331/45 |
| 7,209,533 B1 * | 4/2007 | Nguyen | .................... | H03L 7/08 375/376 |
| 7,271,634 B1 * | 9/2007 | Daga | ..................... | H03L 7/0818 327/149 |
| 8,373,463 B1 * | 2/2013 | Chenakin | .................. | H03L 7/18 327/156 |
| 8,643,414 B1 * | 2/2014 | Navid | ...................... | H03L 7/10 327/156 |
| 11,063,598 B1 * | 7/2021 | Bao | ....................... | H03L 7/0891 |
| 2005/0245200 A1 * | 11/2005 | Kluge | .................. | H03L 7/1974 455/76 |

(Continued)

*Primary Examiner* — Adam D Houston
(74) *Attorney, Agent, or Firm* — Qinghong Xu

(57) ABSTRACT

A phase-locked loop circuit is provided, including: a phase frequency comparing unit to compare phase of an external reference clock signal and phase of a comparing clock signal, and generate an error signal corresponding to the comparing result; an oscillation unit to generate an internal clock signal having oscillation frequency corresponding to the error signal; a frequency dividing unit to divide frequency of the internal clock signal according to a pre-set dividing ratio, to generate the comparing clock signal; a control unit to generate a control signal to respectively change connection of the oscillation unit and connection of the frequency dividing unit after phase comparing. The phase-locked loop circuit can detect and correct mistaken locking and harmonic locking. There is no need to reset the circuit when mistakenly locked, sudden output phase change and additional spike signal that affecting the integrity of the clock signal are prevented.

9 Claims, 8 Drawing Sheets

(56) References Cited

U.S. PATENT DOCUMENTS

| | | | |
|---|---|---|---|
| 2007/0057708 A1* | 3/2007 | Uehara | H03L 7/0891 327/156 |
| 2007/0146024 A1* | 6/2007 | Allan | H03L 7/089 327/156 |
| 2007/0176656 A1* | 8/2007 | Lesso | H03L 7/0812 327/158 |
| 2007/0210842 A1* | 9/2007 | Kawamoto | H03L 7/0816 327/158 |
| 2008/0042698 A1* | 2/2008 | Kim | H03L 7/18 327/116 |
| 2009/0168942 A1* | 7/2009 | Choi | H03L 7/0816 375/373 |
| 2011/0068841 A1* | 3/2011 | Huang | H03K 3/0315 327/156 |
| 2011/0227615 A1* | 9/2011 | Faison | H03L 7/103 327/157 |
| 2014/0177771 A1* | 6/2014 | Maruko | H04L 7/0337 375/375 |
| 2014/0306741 A1* | 10/2014 | Grabinski | H03L 7/113 327/157 |
| 2015/0263740 A1* | 9/2015 | Jung | H03L 7/0818 327/158 |
| 2016/0056806 A1* | 2/2016 | Rapinoja | H03L 7/0816 327/158 |
| 2021/0250030 A1* | 8/2021 | Abuellil | H03K 19/20 |
| 2021/0250031 A1* | 8/2021 | Abuellil | H03L 7/0814 |

\* cited by examiner

PHASE-LOCKED LOOP CIRCUIT, CONTROL METHOD THEREOF AND ELECTRONIC DEVICE

CROSS-REFERENCE TO RELATED APPLICATIONS

This application is based upon and claims priority to Chinese Patent Application No 202010986555.3, filed on Sep. 18, 2020, the entire contents of which are incorporated herein by reference.

TECHNICAL FIELD

The present disclosure relates to semiconductor technology, and more particularly to a phase-locked loop circuit and a control method thereof, a semiconductor device and an electronic device including the phase-locked loop circuit.

BACKGROUND

Clock signals are often needed to transmit from one single device to another one of a data communication system, and the clock signals are often needed to be frequency multiplied or divided. As a jitter factor during the transmission is not good enough, a traditional way to solve the problem is to use a hardware phase-locked loop (PLL) circuit or a delay-locked loop (DLL) circuit to realize clock loop tracking. The delay-locked loop circuit is a circuit capable of outputting a periodic signal, and the periodic signal has a same period with the input clock signal and has a certain delay time.

A core component of the delay-locked loop circuit is a voltage control delay line (VCDL) generally including a plurality of delay units. A main function of the voltage control delay line is generating a plurality of new output signals which have a certain delay time compared to the input signal. For example, the numbers of the new output signals ranges from 1 to i, the delay time of the output signals ranges from t1 to ti. Normally the delay time of each delay unit is the same with each other, that is, the value of each of the delay time ranging from ti−1 to ti is a fixed value. The output signals can be output by connecting two adjacent delay units. However, it can be seen from analysis and simulation that, a phase discriminator only judges whether a wave edge of the output signal at a certain time aligns with a wave edge of the input signal. If the wave edges align with each other, the loop is determined to be correctly locked, the lock state is normally called harmonic locking. When only the wave edges align with each other, there is no multiple relation between the frequency of the output signal and the frequency of the input signal, and mathematical algorithms find that a difference between the output signal of the delay line and a required value is greater than a preset threshold, mathematical algorithms will set the delay time of the delay units of the delay line to a minimum value, and lock the delay line again. However, this may cause the delay line to occur abnormal duty ratio or glitch, and the mathematical algorithms of the data communication system may go wrong when the output signal of the delay-locked loop circuit is used as the system clock.

SUMMARY

In the present disclosure, a phase-locked loop circuit is disclosed, including: a phase frequency comparing unit, configured to compare phase of an external reference clock signal and phase of a comparing clock signal, and generate an error signal corresponding to the comparing result; an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

In the present disclosure, a control method of the phase-locked loop circuit is disclosed, including the following steps: comparing phase of an external reference clock signal and phase of a comparing clock signal, and generating an error signal corresponding to the comparing result; generating an internal clock signal having oscillation frequency corresponding to the error signal; dividing frequency of the internal clock signal according to a pre-set dividing ratio, to generate the comparing clock signal; generating a control signal to respectively change connection of the oscillation unit and connection of the frequency dividing unit after comparing the phase of the external reference clock signal and the phase of the comparing clock signal.

In the present disclosure, a semiconductor device is disclosed, including: a phase frequency comparing unit, configured to compare phase of an external reference clock signal and phase of a comparing clock signal, and generate an error signal corresponding to the comparing result; an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

In the present disclosure, an electronic device is disclosed, including: a phase frequency comparing unit, configured to compare phase of an external reference clock signal and phase of a comparing clock signal, and generate an error signal corresponding to the comparing result, an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

BRIEF DESCRIPTION OF THE DRAWINGS

The nonrestrictive and non-exhaustive embodiments of the present disclosure are described in conjunction with the accompanying drawings. Unless otherwise stated, same reference signs in the figures refer to same or similar elements. The assemblies and components are not drawn to scale, but may be drawn out of scale to make the embodiments of the present disclosure more understandable.

DETAILED DESCRIPTION

In the following, embodiments will be described in detail to illustrate general concept of the present disclosure, but are not intended as a limitation to the protection scope of the present disclosure. The specific features can be used in conjunction with other described features in all kinds of combination and arrangement.

Unless there is a specific definition, each term has a broadest explanation, including the implications implied in the description, the implications understood by the skilled in the art, and/or the implications defined in dictionaries or papers. Technical proposals, technical features, objectives, and effects are described in detail in conjunction with the following embodiments combining with the figures.

Figure 1:
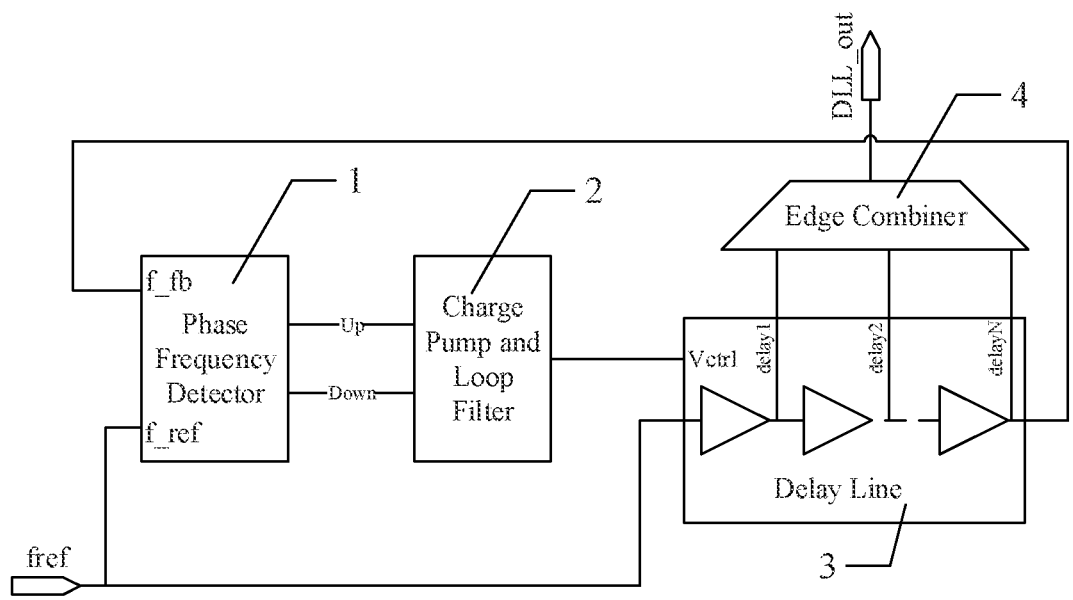
FIG. 1 is a diagram of a delay phase-locked loop circuit in the related art.

FIG. 1 is a diagram of a delay phase-locked loop circuit in the related art, including a phase frequency detector (or a frequency detector) 1, a charge bump and a loop filter 2, a delay line 3 and an edge combiner 4. Delay time of the delay line 3 is controlled by a control end Vtrl, a reference clock fref input to the delay line 3 is delayed thereby. Then the delay line 3 outputs one or more output signals delayN as the feedback signal. The feedback signal is input to an f_fb interface of the phase frequency detector 1, an f_ref interface of the phase frequency detector 1 receives the reference clock fref. The phase frequency detector 1 compares phase of the reference clock fref and phase of the feedback signal delayN to get a phase error, and outputs an error signal up/down corresponding to the phase error to the charge pump and the loop filter 2. Then the charge pump and the loop filter 2 generates a control signal to the control end Vctrl, to control the delay time of the delay line 3 and realize closed loop locking.

Figure 2:
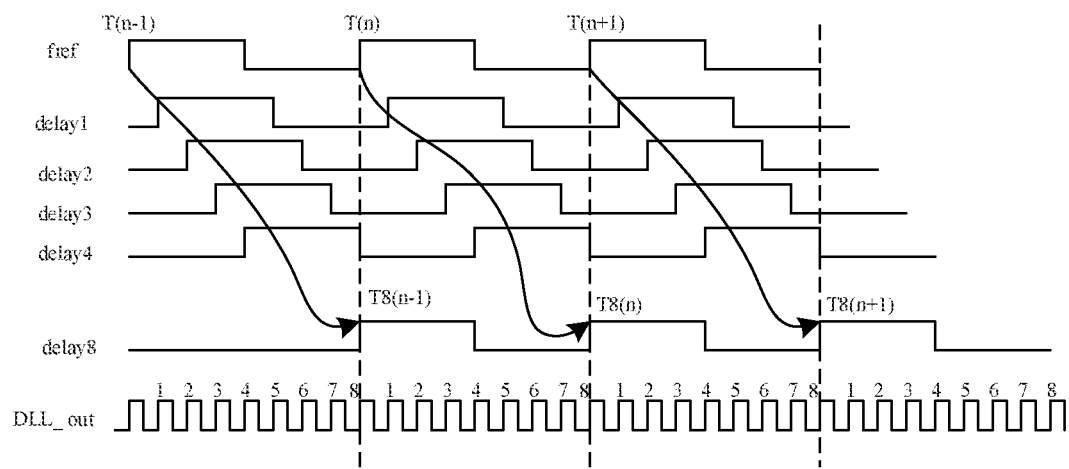
FIG. 2 is a timing diagram when the delay phase-locked loop circuit in FIG. 1 is correctly locked.

Here a delay line having eight-grade delay units is taken as an example. FIG. 2 is a timing diagram when the delay phase-locked loop circuit in FIG. 1 is correctly locked. A total time length of the eight delay units of the whole delay line 3 is equal to a time length of a period of the reference clock fref, that is, an output rising edge of the feedback signal delay8 aligns with an edge of the next period of the reference clock fref. As shown in FIG. 2, a first edge T8(n−1) of the feedback signal delay8 is output after the eight delay units delaying T(n−1) of the reference clock fref, a rising edge of T8(n−1) aligns with a rising edge of T(n), that is T8(n−1)=T(n), the delay line 3 is correctly locked. After the feedback signal delay8 passes through the edge combiner 4, the edge combiner 4 outputs an output signal DLL_out, frequency thereof is eightfold of that of the reference clock.

Figure 3:
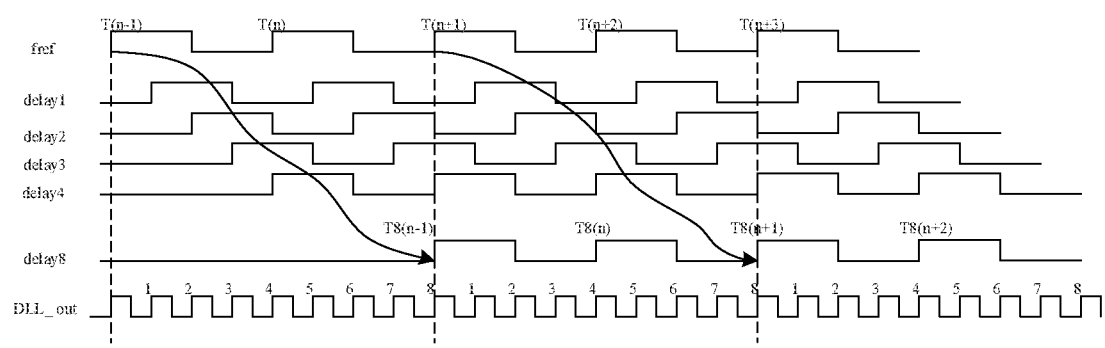
FIG. 3 is a timing diagram when the delay phase-locked loop circuit in FIG. 1 is mistakenly locked.

When the number of grades of the delay line 3 is increased or a delay adjustment range of the delay line 3 is greater, the delay line 3 may be mistakenly locked. FIG. 3 is a timing diagram when the delay phase-locked loop circuit in FIG. 1 is mistakenly locked. The total time length of the eight delay units of the delay line 3 is equal to a time length of two periods of the reference clock. But the output rising edge of the feedback signal delay 8 still aligns with the rising edge of the reference clock fref. Therefore, the delay chain is still locked. But after the feedback signal delay8 passes through the edge combiner 4, the output signal DLL_out of the edge combiner 4 has frequency fourfold of that of the reference clock, which cannot meet the design requirements. But the phase frequency detector 1 only judges whether the rising edge of the reference clock fref aligns with the rising edge of the feedback signal delayN. Therefore, under the above condition, the loop is also locked. The locked state is usually called harmonic locking. Therefore, in the state of harmonic locking, T8(n−1)=T(n+x), x=1, 2, 3 . . . . In the traditional design, when mathematical algorithms find that a difference between the output signal of the delay line and a required value, the delay time of the delay units of the delay line will be set to a minimum value, and the delay line is locked again. However, this may cause the delay line to occur abnormal duty ratio or glitch, and the mathematical algorithms of the data communication system may go wrong when the output signal DLL_out is used as the system clock.

Based on the above technology problems, the present disclosure discloses a phase-locked loop circuit, including: a phase frequency comparing unit, configured to compare phase of an external reference clock signal and phase of a comparing clock signal to get a comparing result, and generate an error signal corresponding to the comparing result; an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

Figure 4:
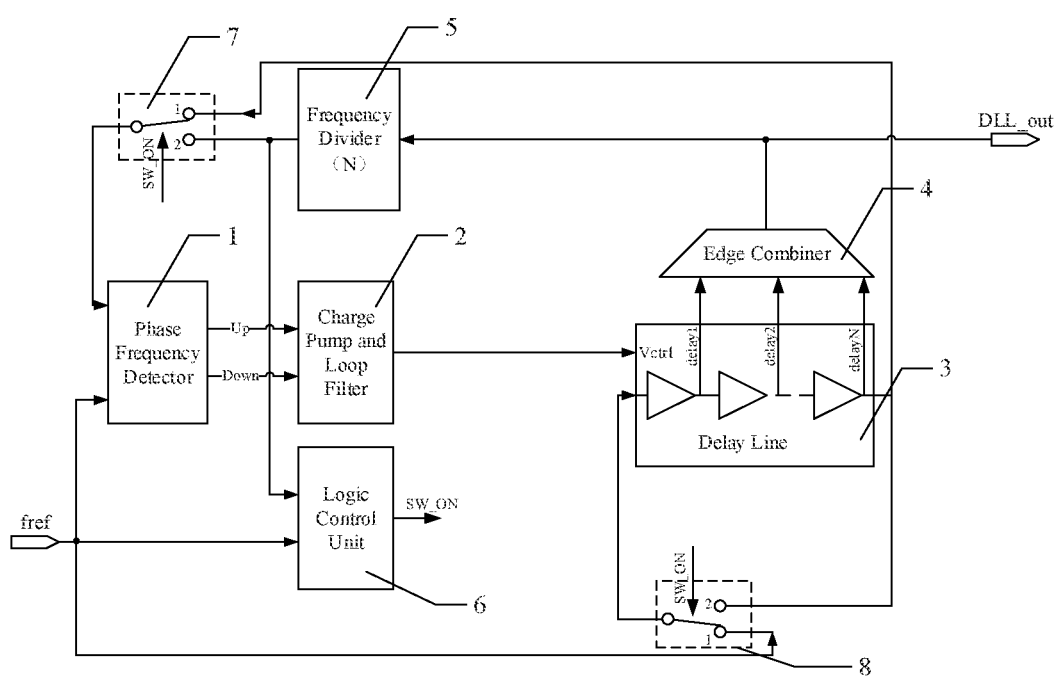
FIG. 4 is a diagram of a phase-locked loop circuit according to an embodiment of the present disclosure.

FIG. 4 is a diagram of a phase-locked loop circuit according to an embodiment of the present disclosure. The phase frequency comparing unit includes a phase frequency detector 1; the oscillation unit includes a charge pump and a loop filter 2, a delay line 3 and an edge combiner 4 connected in series; the frequency dividing unit includes a frequency divider 5; the control unit includes a logic control unit 6, a first switch unit 7 and a second switch unit 8. Wherein, the delay line 3 includes N (N≥1) delay units connected in series.

As seen in FIG. 4, an Nth (N≥1) output end of the delay line 3 is connected to an input end of the edge combiner 4, an output end of the edge combiner 4 is connected to an output port DLL_out and an input end of the frequency divider 5, a second end of the delay line 3 is connected to a first contact of the first switch unit 7 and a second contact of the second switch unit 8, a control end Vctrl of the delay line 3 is connected to an output end of the charge pump and the loop filter 2, an input end of the delay line 3 is connected to a third contact of the second switch unit 8, an output end of the frequency divider 5 is connected to a first input end of the logic control unit 6 and a second contact of the first switch unit 7; a first end of the phase frequency detector 1 is connected to a third contact of the first switch unit 7, a second input end of the phase frequency detector 1, a second input end of the logic control unit 6 and a first contact of the second switch unit 8 are all configured to receive the external reference clock signal fref; an output end of the logic control unit 6 is configured to output the control signal SW_ON, to control connection of the first switch unit 7 and connection of the second switch unit 8. Wherein, each of the first switch unit 7 and the second switch unit 8 is a single-pole double-throw switch, the third contact of the first switch unit 7 and the third contact of the second switch unit 8 are both movable contacts. In some alternative embodiments, a digital circuit can be used to replace the single-pole double-throw switch, which is also included in the protection scope of the present disclosure.

Here eight frequency division is taken as an example. As shown in FIG. 4, when the phase-locked loop circuit of the embodiment is correctly locked, the logic control unit 6 compares the phase of the external reference signal fref and the phase of the output signal DIV(N) out (i.e. the comparing clock signal) of the frequency divider 5. If the two signals are in coincidence with each other, the logic control unit 6 generates a first control signal, to control the third contact of the first switch 7 to connect to the first contact of the first switch 7, and control the third contact of the second switch unit 8 to connect to the first contact of the second switch unit 8, the delay line 3 can be reserved in the DLL loop.

Figure 5:
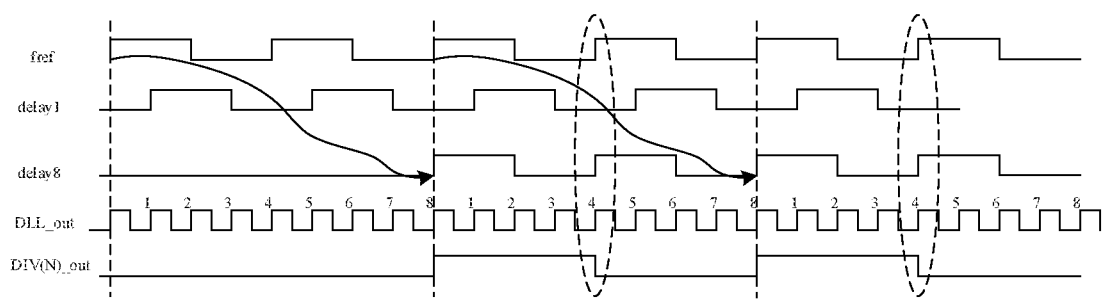
FIG. 5 is a timing diagram when the phase-locked loop circuit in FIG. 4 is mistakenly locked.

FIG. 5 is a timing diagram when the phase-locked loop circuit in FIG. 4 is mistakenly locked. As shown in FIG. 5, when the phase-locked loop circuit of the embodiment is mistakenly locked, as the output signal of the output port DLL_out is not equal to eightfold of the external reference clock signal, the frequency of the output signal DIV(N)_out of the frequency divider 5 is not the same with that of the external reference signal after the signal is divided to eight parts. When the logic control unit 6 compares the phase of the external reference signal fref and the phase of the output signal DIV(N)_out of the frequency divider 5, as shown in the area surrounded by a dotted line border, the rising edge of the external reference signal fref is not in coincidence with the rising edge of the output signal DIV(N)_out, the logic control unit 6 determines the state of the phase-locked loop circuit is harmonic locking.

After the logic control unit 6 compares the phase of the external reference signal fref and the phase of the comparing clock signal DIV(N)_ou, and determines the state of the phase-locked loop circuit is harmonic locking, the logic control unit 6 generates a second control signal, to control the third contact of the first switch unit 7 to connect to the second contact of the first switch unit 7, and the third contact of the second switch unit 8 to connect to the second contact of the second switch unit 8. The connection of the first switch unit 7 and the connection of the second switch unit 7 are shown in FIG. 6, which is a diagram of the phase-locked loop circuit in FIG. 4 when it's corrected after mistakenly locked.

After the logic control unit 6 compares the phase of the external reference signal fref and the phase of the comparing clock signal DIV(N) ou, there is no rising edge of the comparing clock signal DIV(N) ou nearby the external reference signal fref. As shown in FIG. 6, the logic control unit 6 generates a second control signal to control the third contact of the first switch unit 7 to the second contact of the first switch unit 7, and control the third contact of the second switch unit 8 to the second contact of the second switch unit 8. The input end of the delay line 3 is connected to its output end to form a voltage-controlled oscillator (VCO). The whole circuit forms a PLL loop. As the phase-locked loop circuit is mistakenly locked, the 8th output end delay 8 of the delay line 3 outputs high level voltage, the phase thereof is the same with the phase of the external reference clock signal fref. Therefore, no mistaken glitch will be output from the output port DLL_out. The phase frequency detector 1 compares the feedback signal output from the frequency divider 5 and the external reference clock signal fret; and the charge pump and the loop filter 2 transforms the comparing result to a control voltage to control the delay time of the delay line 3, thereby changing the output frequency of the voltage-controlled oscillator. After X periods (a time length of one period depends on bandwidth of the loop), until the phase of the external reference clock signal fref is in coincidence with the phase of the comparing clock signal DIV(N)_out again in the PLL loop, the circuit can go back to the state of DLL loop locking, that is, back to the state shown in FIG. 4.

Figure 6:
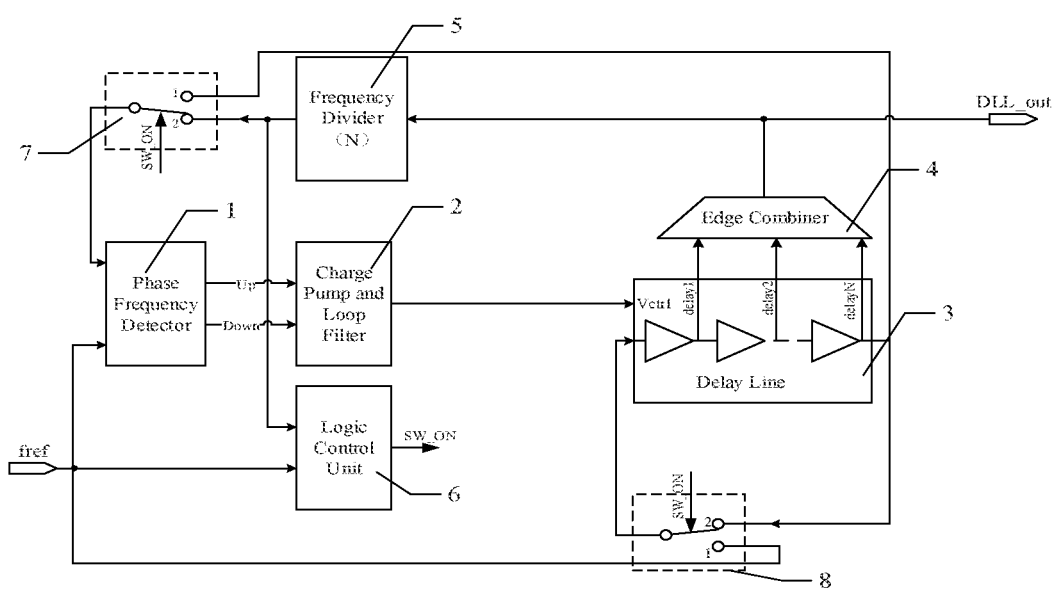
FIG. 6 is a diagram of the phase-locked loop circuit in FIG. 4 when it's corrected after mistakenly locked.
Figure 7:
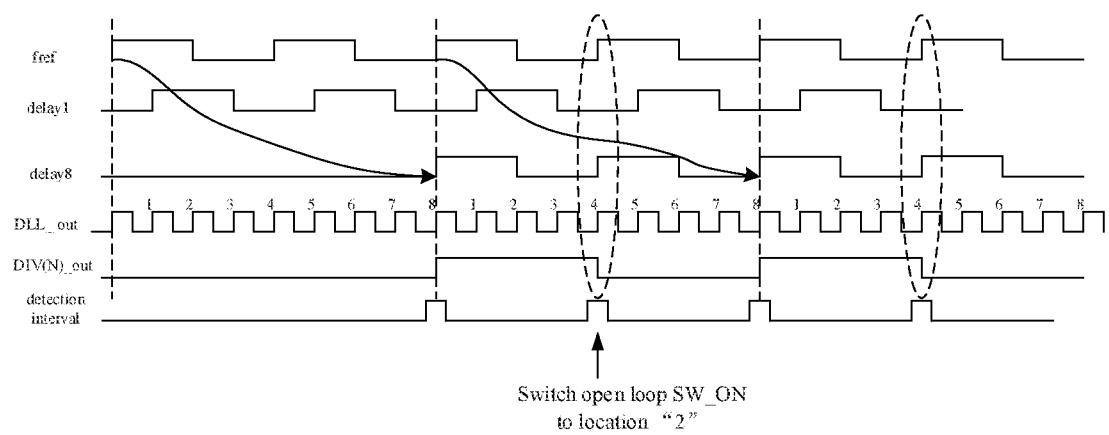
FIG. 7 is a timing diagram when the phase-locked loop circuit in FIG. 6 is corrected after mistakenly locked.

FIG. 7 is a timing diagram of the phase-locked loop circuit of FIG. 6. After the logic control unit 6 compares the phase of the external reference signal fref and the phase of the comparing clock signal DIV(N)_ou, as shown in the area surrounded by a dotted line border, there is no rising edge of the comparing clock signal DIV(N)_ou nearby the rising edge of the external reference signal fref, the state of the phase-locked loop circuit is determined to be harmonic locking. The logic control unit 6 generates a second control signal, to control the third contact of the first switch 7 to connect to the second contact of the first switch 7, and control the third contact of the second switch unit 8 to connect to the second contact of the second switch unit 8, until the phase of the external reference signal fref is are in coincidence with the phase of the comparing clock signal DIV(N) ou.

In the present disclosure, the frequency divider 5 and the logic control unit 6 are added to a traditional DLL loop, and the first switch unit 7 and the second switch unit 8 are respectively added to the input end and the output end of the delay line 3. Therefore, the phase-locked loop circuit of the present disclosure can automatically detect whether the phase-locked loop circuit is locked correctly and correct the mistaken locking and harmonic locking of the phase-locked loop circuit. When the delay-locked loop circuit is mistakenly locked, there is no need to reset the circuit, therefore the signal phase output from the phase-locked loop circuit will not change suddenly, and no additional spike signal occurs. In the condition using the phase-locked loop circuit as a system clock, the system error caused by clock glitch that affecting the integrity of clock signal is also prevented.

Figure 8:
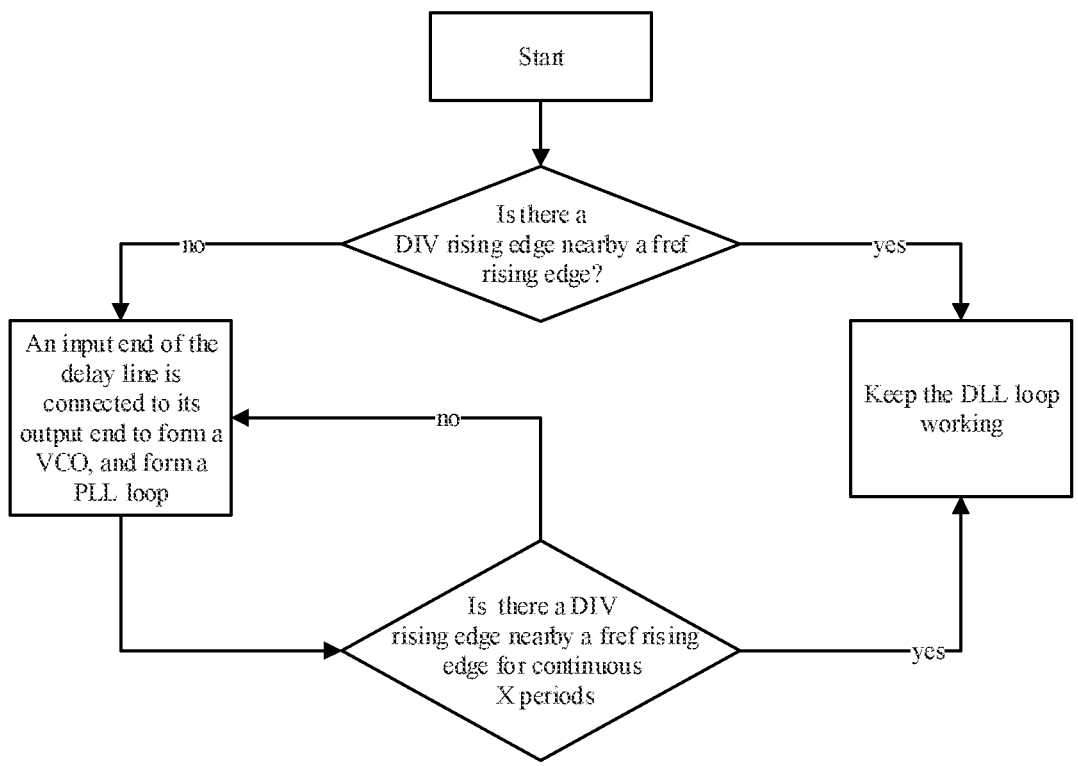
FIG. 8 is flow chart of a control method of a phase-locked loop circuit according to another embodiment of the present disclosure.

Another embodiment of the present disclosure provides a control method of the phase-locked loop circuit, including: comparing phase of an external reference clock signal and phase of a comparing clock signal to get a comparing result, and generating an error signal corresponding to the comparing result, generating an internal clock signal having oscillation frequency corresponding to the error signal; dividing frequency of the internal clock signal according to a pre-set dividing ratio, to generate the comparing clock signal; generating a control signal to respectively change connection of the oscillation unit and connection of the frequency dividing unit after comparing the phase of the external reference clock signal and the phase of the comparing clock signal. Wherein, the specific steps of generating a control signal to respectively change connection of the oscillation unit and connection of the frequency dividing unit after comparing the phase of the external reference clock signal and the phase of the comparing clock signal is shown in FIG. 8, which is flow chart of a control method of a phase-locked loop circuit according to another embodiment of the present disclosure. Combining with FIG. 4 and FIG. 6, it can be seen that the logic control unit 6 compares the phase of the external reference signal fref and the phase of the signal DIV(N) out (i.e. the comparing clock signal) output from the frequency divider 5. When the comparing clock signal DIV(N) out has a rising edge nearby the rising edge of the external reference clock signal fref the logic control unit 6 generates a first control signal, to control the third contact of the first switch unit 7 to connect to the first contact of the first switch unit 7, and control the third contact of the second switch unit 8 to connect to the first contact of the second switch unit 8. The delay line 3 can be reserved in the DLL loop. If the comparing clock signal DIV(N) out has a rising edge nearby the rising edge of the external reference clock signal fref for continuous X periods, the delay line 3 keeps the DLL working. When the comparing clock signal DIV(N) out has no rising edge nearby the rising edge of the external reference clock signal fref the logic control unit 6 generates a second control signal, to control the third contact of the first switch unit 7 to connect to the second contact of the first switch unit 7, and control the third contact of the second switch unit 8 to connect to the second contact of the second switch unit 8. The input end of the delay line 3 is connected to the output end of the delay line 3, to form a voltage-controlled oscillator VCO. The whole circuit forms a PLL loop. After X periods (a length of one period depends on the bandwidth of the loop), until the phase of the external reference clock signal fref is in coincidence with the phase of the comparing clock signal DIV(N)_out in a PLL loop, the circuit can go back to the state of DLL loop locking.

Another embodiment of the present disclosure provides a semiconductor device is provided, including: a phase frequency comparing unit, configured to compare phase of an external reference clock signal and phase of a comparing clock signal, and generate an error signal corresponding to the comparing result; an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

Another embodiment of the present disclosure provides an electronic device is provided, including: a phase frequency comparing unit, configured to compare phase of an external reference clock signal and phase of a comparing clock signal, and generate an error signal corresponding to the comparing result; an oscillation unit, configured to generate an internal clock signal having oscillation frequency corresponding to the error signal; a frequency dividing unit, configured to divide frequency of the internal clock signal according to a pre-set dividing ratio, to generate the comparing clock signal; a control unit, configured to generate a control signal to respectively change connection of the oscillation unit and connection of the frequency dividing unit after comparing the phase of the external reference clock signal and the phase of the comparing clock signal.

Compared with the related art, the present disclosure at least has the following advantages.

The phase-locked loop circuit of the present disclosure can automatically detect whether the phase-locked loop circuit is locked correctly and correct the mistaken locking and harmonic locking of the phase-locked loop circuit. When the phase-locked loop circuit is mistakenly locked, there is no need to reset the circuit, therefore the signal phase output from the phase-locked loop circuit will not change suddenly, and no additional spike signal occurs. In the condition using the phase-locked loop circuit as a system clock, the system error caused by clock glitch that affecting the integrity of clock signal is also prevented.

Unless defined clearly in the context, the terms such as "including", "having" etc. in the claims and description are all explained to inclusive implications, rather than exclusive or exhaustive implications. That is, the terms "including", "having" are explained to "including, but not limited to". The term "connecting" normally means that two or more components are connected directly, or connected through one or more intermediated components. Besides, the terms "here", "above", "in the following" in the present disclosure refer to the whole context of the present disclosure, rather than any specific part of the present disclosure. When it is allowed by the context, the words in singular or plural form may also respectively include plural or singular. The word "or" related to a list of two or more items cover the any one of the following explanations: any item in the list, all items in the list, or any combination of the items in the list.

The enlightenment of the present disclosure provided here can be used in other systems, rather than limited to the above system. More embodiments can be gotten by combining the components and actions of the above embodiments.

It should be readily understood that the description of the embodiments is exemplary and explanatory only, and are not intended as a limitation to the protection scope of the present disclosure. Indeed, new methods and systems can be realized in all kinds of forms. Besides, omitting, modifications and substitutions can be made to the forms of the methods and systems, without departing from the spirit and scope of the present disclosure. The attached claims and equivalent definitions mean to cover all the forms and modifications within the spirit and scope of the present disclosure.

What is claimed is:

1. A phase-locked loop circuit comprising:
a phase frequency comparing unit, configured to compare phase of an external reference clock signal and phase of a comparing clock signal, and generate an error signal corresponding to the comparing result;
an oscillation unit, configured to generate an internal clock signal having oscillation frequency corresponding to the error signal;
a frequency dividing unit, configured to divide frequency of the internal clock signal according to a pre-set dividing ratio, to generate the comparing clock signal;
a control unit, configured to generate a control signal to respectively change connection of the oscillation unit and connection of the frequency dividing unit after comparing the phase of the external reference clock signal and the phase of the comparing clock signal.

2. The phase-locked loop circuit according to claim 1, wherein, the phase frequency comparing unit comprises a phase frequency detector; the oscillation unit comprises a charge pump, a loop filter, a delay line, and an edge combiner connected in series; the frequency dividing unit comprises a frequency divider, the control unit comprises a logic control unit, a first switch unit and a second switch unit.

3. The phase-locked loop circuit according to claim 2, wherein, an Nth output end of the delay line is connected to an input end of the edge combiner, wherein N≥1, an output end of the edge combiner is connected to an output port and an input end of the frequency divider, a second output end of the delay line is connected to a first contact of the first switch unit and a second contact of the second switch unit, a control end of the delay line is connected to an output end of the loop filter, an input end of the delay line is connected to a third contact of the second switch unit, an output end of the frequency divider is connected to a first input end of the logic control unit and a second contact of the first switch unit; a first input end of the phase frequency detector is connected to a third contact of the first switch unit, a second input end of the phase frequency detector, a second input end of the logic control unit and a first contact of the second switch unit are all configured to receive the external reference clock signal; an output end of the logic control unit is configured to output the control signal, to control connection of the first switch unit and connection of the second switch unit.

4. The phase-locked loop circuit according to claim 2, wherein, each of the first switch unit and the second switch unit comprises a single-pole double-throw switch.

5. The phase-locked loop circuit according to claim 3, wherein, the logic control unit is configured to generate a first control signal after comparing the phase of the external reference clock signal and the phase of the comparing clock signal, to control the third contact of the first switch unit to connect to the first contact of the first switch unit, and control the third contact of the second switch unit to connect to the first contact of the second switch unit.

6. The phase-locked loop circuit according to claim 3, wherein, the logic control unit is configured to generate a second control signal after comparing the phase of the external reference clock signal and the phase of the comparing clock signal, to control the third contact of the first switch unit to connect to the second contact of the first switch unit, and control the third contact of the second switch unit to connect to the second contact of the second switch unit.

7. The phase-locked loop circuit according to claim 2, wherein, the delay line comprises N delay units connected in series, wherein N≥1.

8. A control method of the phase-locked loop circuit comprising the following steps:
 comparing phase of an external reference clock signal and phase of a comparing clock signal, and generating an error signal corresponding to the comparing result;
 generating an internal clock signal having oscillation frequency corresponding to the error signal;
 dividing frequency of the internal clock signal according to a pre-set dividing ratio, to generate the comparing clock signal;
 generating a control signal to respectively change connection of the oscillation unit and connection of the frequency dividing unit after comparing the phase of the external reference clock signal and the phase of the comparing clock signal.

9. An electronic device comprising:
 a phase frequency comparing unit, configured to compare phase of an external reference clock signal and phase of a comparing clock signal, and generate an error signal corresponding to the comparing result;
 an oscillation unit, configured to generate an internal clock signal having oscillation frequency corresponding to the error signal;
 a frequency dividing unit, configured to divide frequency of the internal clock signal according to a pre-set dividing ratio, to generate the comparing clock signal;
 a control unit, configured to generate a control signal to respectively change connection of the oscillation unit and connection of the frequency dividing unit after comparing the phase of the external reference clock signal and the phase of the comparing clock signal.

\* \* \* \* \*